United States Patent
Okawa et al.

(10) Patent No.: US 7,149,944 B2
(45) Date of Patent: Dec. 12, 2006

(54) SEMICONDUCTOR INTEGRATED CIRCUIT DEVICE EQUIPPED WITH READ SEQUENCER AND WRITE SEQUENCER

(75) Inventors: Hiroyuki Okawa, Yokohama (JP); Junji Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 10/852,486

(22) Filed: May 25, 2004

(65) Prior Publication Data
US 2005/0182993 A1    Aug. 18, 2005

(30) Foreign Application Priority Data
Feb. 17, 2004    (JP)    .............. 2004-040131

(51) Int. Cl.
*G01R 31/28*    (2006.01)
(52) U.S. Cl. ............. 714/738; 714/718; 714/744
(58) Field of Classification Search ......... 370/526; 345/505; 710/5; 365/233, 193; 711/217, 711/169; 714/718, 738, 744
See application file for complete search history.

(56) References Cited

U.S. PATENT DOCUMENTS

| | | | | |
|---|---|---|---|---|
| 4,908,825 A | * | 3/1990 | Vea | .............. 370/526 |
| 5,109,348 A | * | 4/1992 | Pfeiffer et al. | .............. 345/505 |
| 5,768,617 A | * | 6/1998 | Liu | .............. 710/5 |
| 6,775,759 B1 | * | 8/2004 | Janzen | .............. 711/217 |
| 6,788,616 B1 | * | 9/2004 | Takahashi | .............. 365/233 |
| 6,836,831 B1 | * | 12/2004 | Borkenhagen et al. | .............. 711/169 |
| 6,839,290 B1 | * | 1/2005 | Ahmad et al. | .............. 365/193 |

OTHER PUBLICATIONS

Nadeau-Dostie, B., "Design For AT-Speed Test, Diagnosis and Measurement", Kluwer Academic Publishers, Chapter 2: pp. 35-57, (2000).

* cited by examiner

*Primary Examiner*—David Ton
(74) *Attorney, Agent, or Firm*—Finnegan, Henderson, Farabow, Garrett & Dunner, L.L.P.

(57) ABSTRACT

A semiconductor integrated circuit device includes a semiconductor memory circuit device, a first sequencer, and a second sequencer. The semiconductor memory circuit device stores data. The first sequencer controls writing of data into the semiconductor memory circuit device. The second sequencer controls reading of data from the semiconductor memory circuit device.

11 Claims, 14 Drawing Sheets

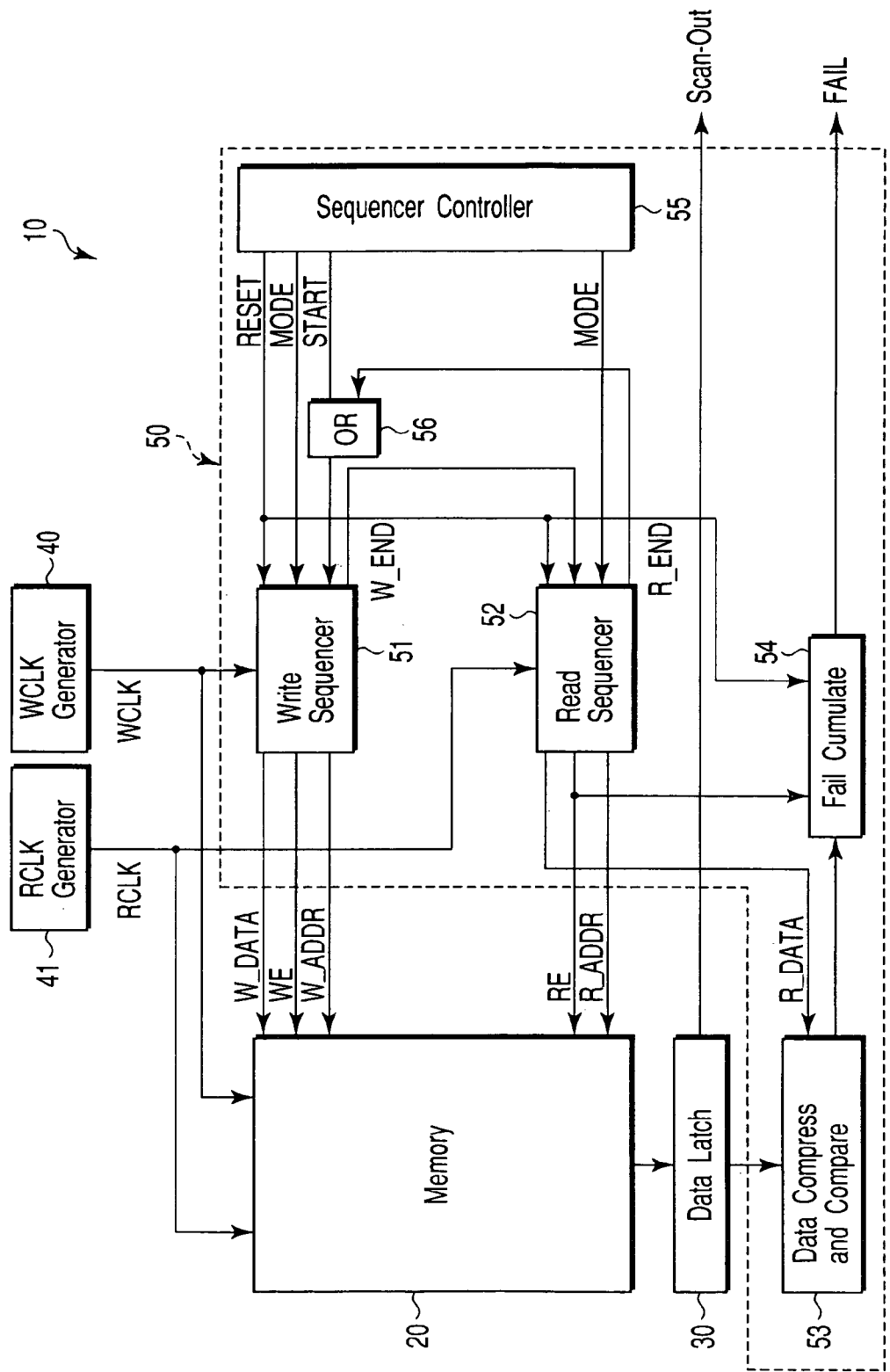
F I G. 1

F I G. 5  Alternative Mode

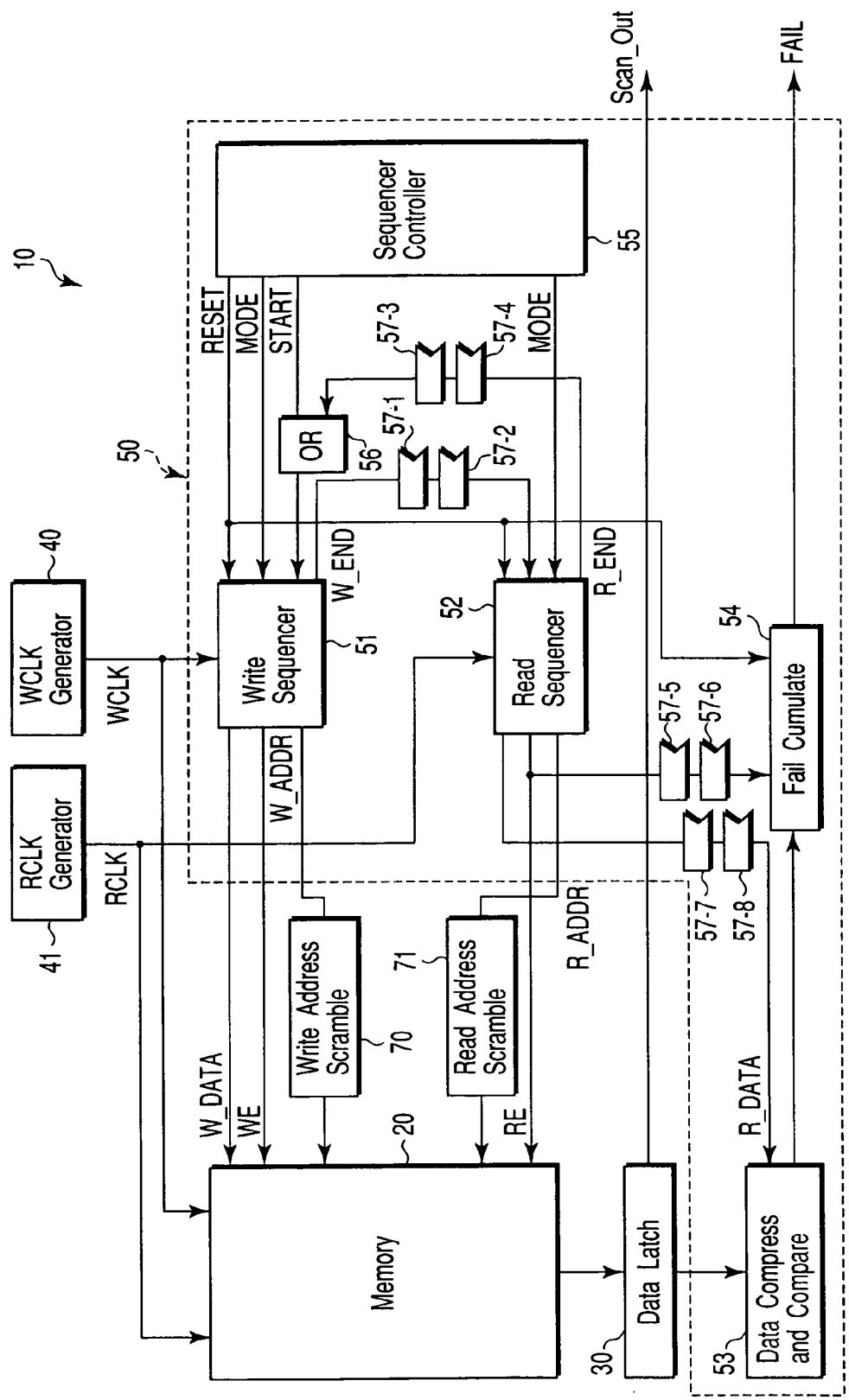
F I G. 9

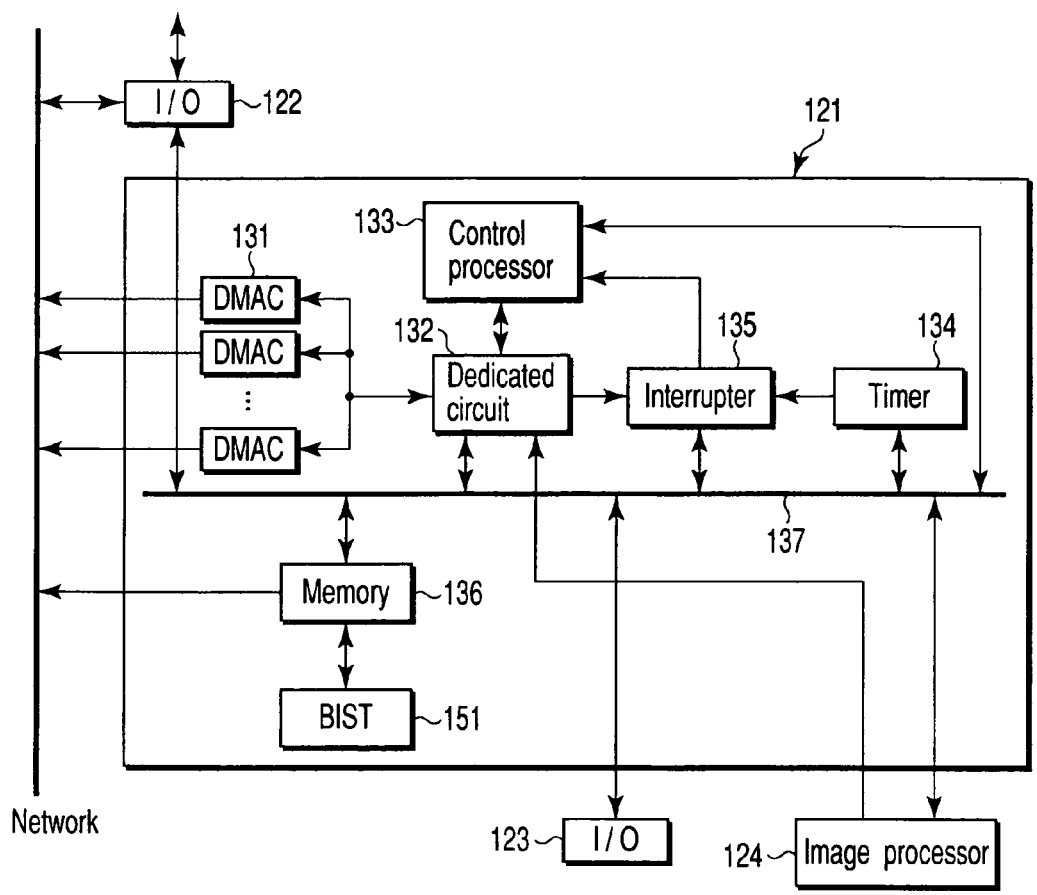
F I G. 12

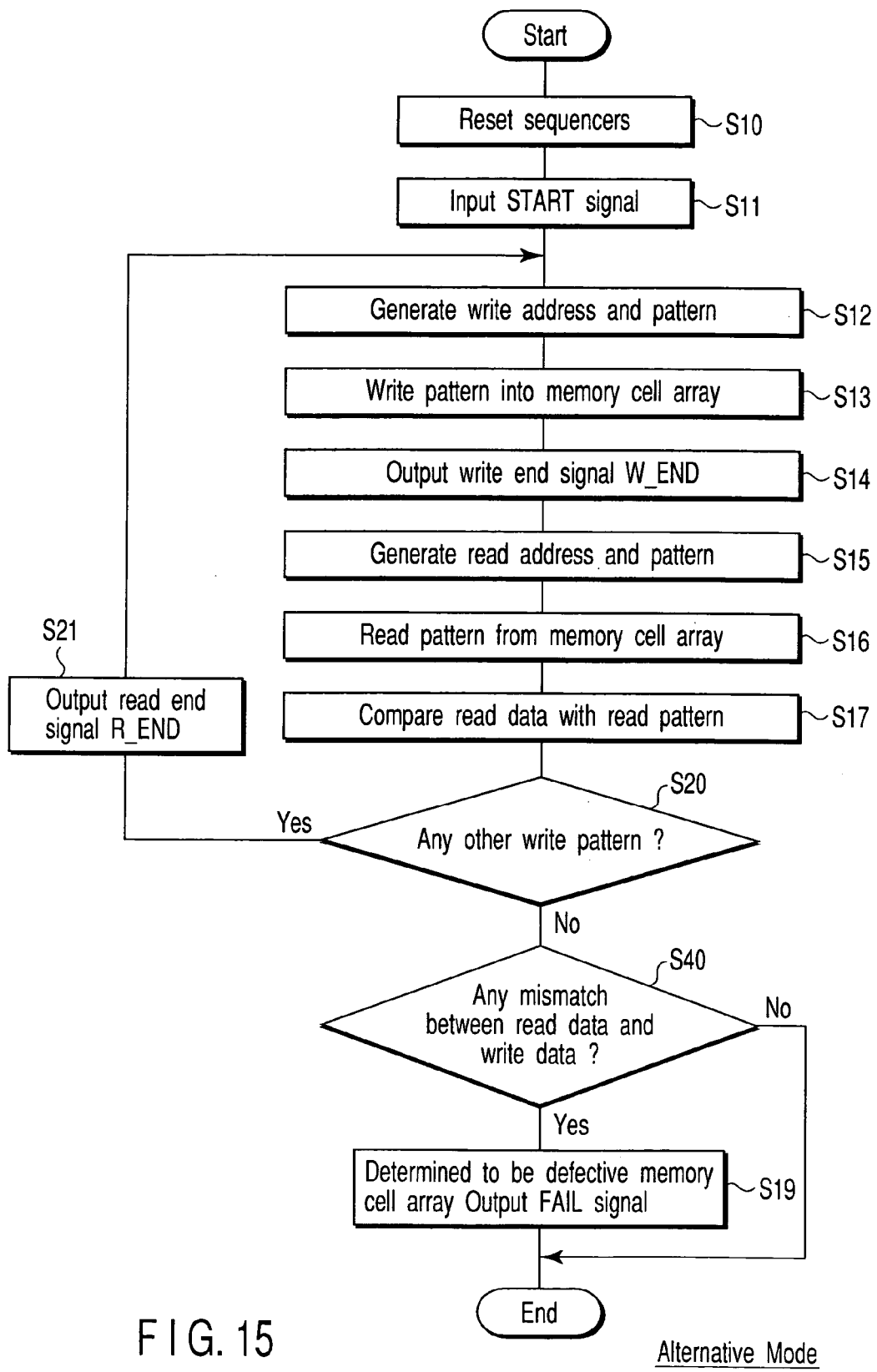
FIG. 15  Alternative Mode

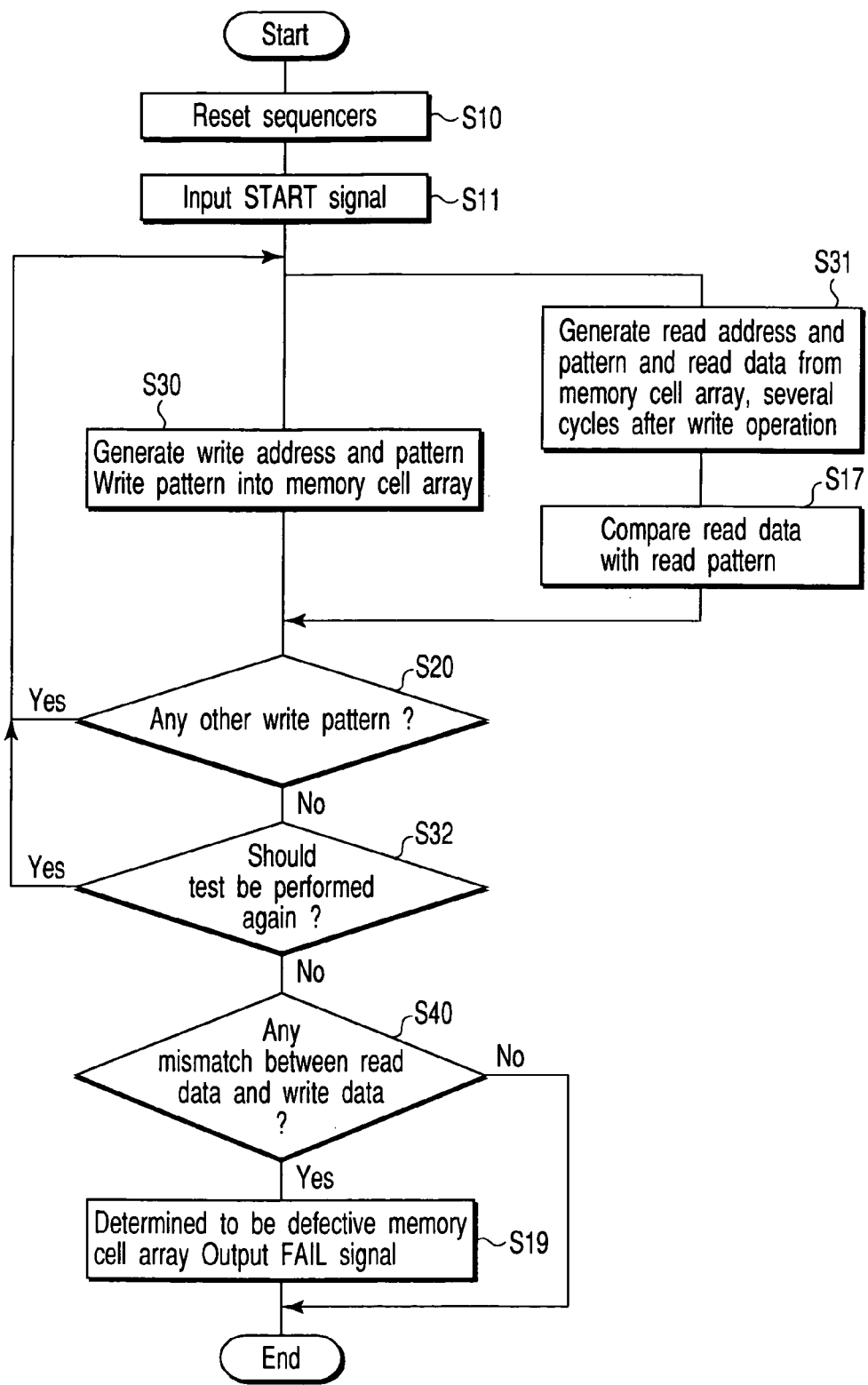
FIG. 16  Successive Mode

SEMICONDUCTOR INTEGRATED CIRCUIT DEVICE EQUIPPED WITH READ SEQUENCER AND WRITE SEQUENCER

CROSS-REFERENCE TO RELATED APPLICATIONS

This application is based upon and claims the benefit of priority from prior Japanese Patent Application No. 2004-040131, filed Feb. 17, 2004, the entire contents of which are incorporated herein by reference.

BACKGROUND OF THE INVENTION

1. Field of the Invention

The present invention relates to a semiconductor integrated circuit device, and more particularly to a test method for testing, for example, a semiconductor memory.

2. Description of the Related Art

In accordance with increases in the scale of large scale integrated circuits (LSIs), it is becoming difficult to test the circuits during development or manufacturing. Therefore, LSI testing techniques are becoming more and more important.

In conventional LSI function tests, it is determined whether an LSI is faulty by inputting test patterns to the input terminals of the LSI and checking whether the data from the output terminals is as expected. Further, in accordance with the increase in structural complexity of LSIs, designs for testability have been developed. As designs for testability, a scan design method, a method incorporating a built-in self-test (BIST), etc., are widely known. Concerning designs for testability, see, for example, "Design for AT-SPRRD Test, Diagnosis and Measurement", Chapter 2, pp. 35–57, by Benoit Nadeau-Dostie, published by Kluwer Academic Publishers in 2000.

However, in accordance with recent increases in LSI scale and operation frequency, it has become difficult for conventional test methods to guarantee the operation of LSIs. For example, since the structure of LSIs has become very complex, a large number of test patterns must be input to them, which requires considerable time and expense. Also in the method of incorporating a BIST circuit, the testing costs and time are increased because the operations of LSIs are very complex.

BRIEF SUMMARY OF THE INVENTION

A semiconductor integrated circuit device according to an aspect of the present invention comprises: a semiconductor memory device which stores data;

a first sequencer which controls writing of data into the semiconductor memory device; and a second sequencer which controls reading of data from the semiconductor memory device.

BRIEF DESCRIPTION OF THE SEVERAL VIEWS OF THE DRAWING

FIG. 1 is a block diagram illustrating a semi-conductor integrated circuit device according to a first embodiment of the invention;

FIG. 9 is a block diagram illustrating a semi-conductor integrated circuit device according to a second embodiment of the invention;

FIG. 12 is a block diagram illustrating a controller incorporated in the image processor of FIG. 11;

FIG. 15 is a flowchart illustrating the flow of a test method employed when a modification of the semiconductor integrated circuit devices of the first to third embodiments is in the alternative mode; and FIG. 16 is a flowchart illustrating the flow of a test method employed when a modification of the semiconductor integrated circuit devices of the first to third embodiments is in the successive mode.

DETAILED DESCRIPTION OF THE INVENTION

Figure 2:
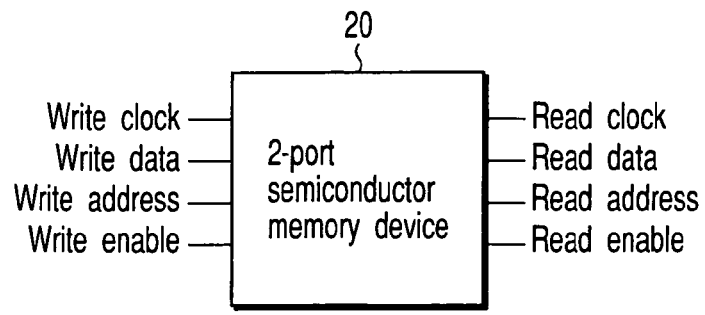
FIG. 2 is a block diagram illustrating a semiconductor memory device incorporated in the semiconductor integrated circuit device of the first embodiment.

Referring first to FIG. 1, a semiconductor integrated circuit device according to a first embodiment of the invention will be described. FIG. 1 is a block diagram illustrating the internal configuration of a memory-embedded semiconductor integrated circuit (LSI).

As shown, an LSI 10 comprises a semiconductor memory 20, data latch 30, clock generators 40 and 41 and BIST circuit 50. The semiconductor memory 20 is, for example, a dynamic random-access memory (DRAM), static RAM (SRAM) or flash memory, and is used to hold data supplied from the outside. The data latch 30 temporarily latches data when the data is read from the semiconductor memory 20. The clock generator 40 generates a clock signal WCLK used to write data into the semiconductor memory 20. The clock generator 41 generates a clock signal RCLK used to read data from the semiconductor memory 20. The BIST circuit 50 is provided for testing the semiconductor memory 20, and operates only when the semiconductor memory 20 is tested.

Accordingly, the BIST circuit 50 does not operate during the normal operation of the LSI 10.

The configuration of the BIST circuit 50 will be described. The BIST circuit 50 includes a write sequencer 51, read sequencer 52, data compression/comparison circuit 53, fail signal output circuit 54, sequencer controller 55 and OR circuit 56.

The sequencer controller 55 controls the write sequencer 51 and read sequencer 52. More specifically, the sequencer controller 55 controls the operation modes and timing of the sequencers 51 and 52, using a reset signal RESET, mode signal MODE and start signal START. The manner of control will be described later in detail.

The write sequencer 51 controls writing of data into the semiconductor memory 20, when the memory 20 is tested. More specifically, during the test of writing, the write sequencer 51 generates write pattern data W_DATA to be written into the semiconductor memory 20, a write address signal W_ADDR and a write enable signal WE, and supplies them to the semiconductor memory 20.

The read sequencer 52 controls reading of data from the semiconductor memory 20, when the memory 20 is tested. More specifically, during the test of reading, the read sequencer 52 generates pattern data R_DATA as data expected to be read from the semiconductor memory 20, a read address signal R_ADDR and a read enable signal RE, and supplies them to the semiconductor memory 20.

The sequencers 51 and 52 each have two operation modes—an alternative mode and successive mode. The alternative mode is a test mode in which the clock signals WCLK and RCLK are not synchronized with each other. The successive mode is a test mode in which the clock signals WCLK and RCLK are synchronized with each other. In the alternative mode, reading data from the memory cell array and writing data to the array are performed alternately. After finishing the write operation, the write sequencer 51 supplies the read sequencer 52 with an end signal W_END. Upon receiving the end signal W_END, the read sequencer 52 starts a read operation. After finishing the read operation, the read sequencer 52 supplies the write sequencer 51 with an end signal R_END. Subsequently, in response to the end signal R_END, the write sequencer 51 starts the next write operation. The test methods performed in the alternative mode and successive mode will be described later in detail.

The data compression/comparison circuit 53 compares read data latched by the data latch 30 with pattern data R_DATA generated by the read sequencer 52, thereby compressing the comparison result. For example, the circuit 53 compares read data and pattern data R_DATA of 64 bits or 128 bits, and compresses the comparison result into a signal of a several-bit length.

The fail signal output circuit 54 operates in response to the read enable signal RE output from the read sequencer 52. Depending upon the result of the data compression/comparison circuit 53, the circuit 54 outputs a fail signal FAIL. That is, if the pattern data R_DATA generated by the read sequencer 52 does not match the read data, the fail signal FAIL is output.

The OR circuit 56 performs an OR operation on the start signal START and end signal R_END, and supplies the operation result to the write sequencer 51.

FIG. 2 is a block diagram illustrating the semiconductor memory 20. As shown, the semiconductor memory 20 is a 2-port memory device, which has two clock terminals, data terminals, address terminals and enable terminals. The respective two clock terminals receive the write clock signal WCLK and read clock signal RCLK. One of the two data terminals receives write data W_DATA, and the other data terminal outputs read data R_DATA. The respective two-address-terminals receive the write address signal W_ADDR and read address signal R_ADDR. The respective two enable terminals receive the write enable signal WE and read enable signal RE.

Thus, in a 2-port memory, input/output terminals needed for writing are independent of input/output terminals needed for reading. Therefore, write and read operations can be performed simultaneously if they are performed on cells of different addresses. On the other hand, in a 1-port memory, input/output terminals are commonly used to perform write and read operations. Therefore, write and read operations cannot be simultaneously performed. In other words, only one operation can be performed at a time.

Figure 3:
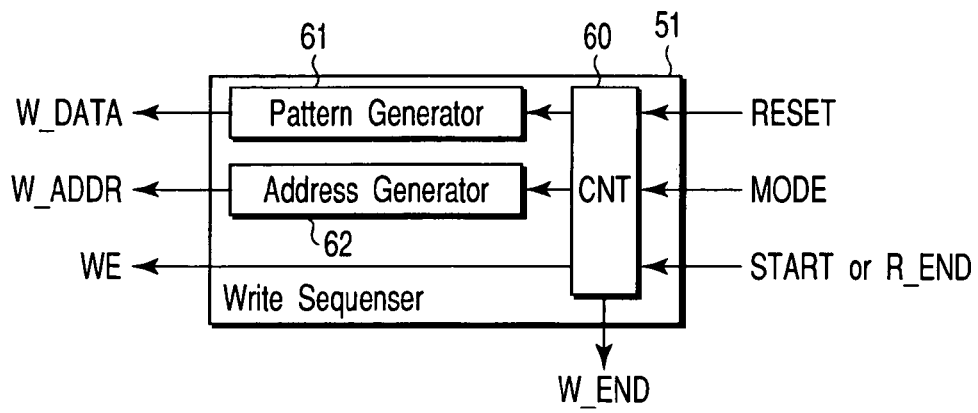
FIG. 3 is a block diagram illustrating a write sequencer incorporated in the semiconductor integrated circuit device of the first embodiment.

FIG. 3 is a block diagram illustrating the internal configuration of the write sequencer 51. As shown, the write sequencer 51 comprises a controller 60, pattern generator 61 and address generator 62.

The controller 60 operates in response to the reset signal RESET or mode signal MODE supplied from the outside, or a signal obtained from an OR operation of the start signal START and end signal R_END, thereby controlling the pattern generator 61 and address generator 62. Further, after a write operation finishes, the controller 60 outputs an end signal W_END. The pattern generator 61 generates pattern data W_DATA to be written into the semiconductor memory 20. The address generator 62 generates an address signal W_ADDR indicating the memory cells into which write data should be written.

Figure 4:
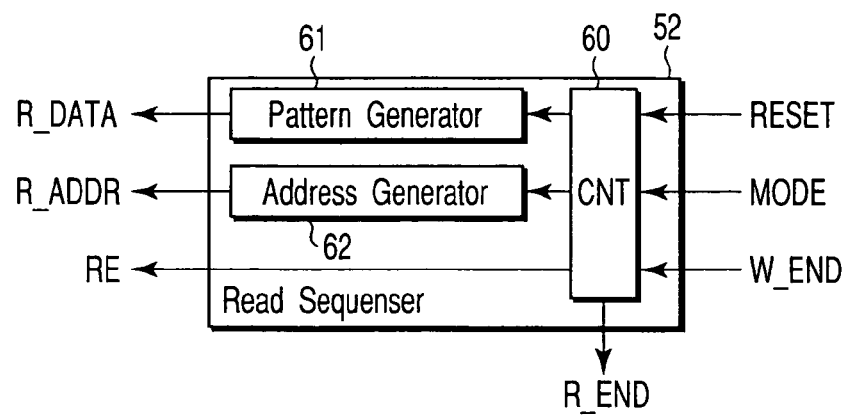
FIG. 4 is a block diagram illustrating a read sequencer incorporated in the semiconductor integrated circuit device of the first embodiment.

FIG. 4 is a block diagram illustrating the internal configuration of the read sequencer 52. As shown, the read sequencer 52 has the same configuration as the write sequencer 51, and comprises a controller 60, pattern generator 61 and address generator 62.

The controller 60 operates in response to the reset signal RESET, mode signal MODE, start signal START or end signal R_END supplied from the outside, thereby controlling the pattern generator 61 and address generator 62. Further, after a read operation finishes, the controller 60 outputs an end signal R_END. The pattern generator 61 generates pattern data R_DATA as data expected to be read from the semi-conductor memory 20. The pattern data R_DATA has the same pattern as the write pattern data W_DATA generated by the pattern generator 61 of the write sequencer 51. The address generator 62 generates an address signal R_ADDR indicating the memory cells from which data should be read. The address signals R_ADDR and W_ADDR indicate the same memory cells.

A method for testing the semiconductor memory 20 provided with the above-described LSI will now be described. The semiconductor memory 20 is tested such that data is written into cells in the memory 20 and read therefrom, and it is determined whether the read data is identical to the write data. If they are not identical to each other, the memory is determined to be defective. As stated above, there are two test modes—the alternative mode and successive mode. These modes will be described.

<Alternative Mode>

The alternative mode is a test mode in which the clock signal WCLK for controlling writing is not synchronized with the clock signal RCLK for controlling reading. In the alternative mode, write and read operations are performed alternately as described above.

Figure 5:
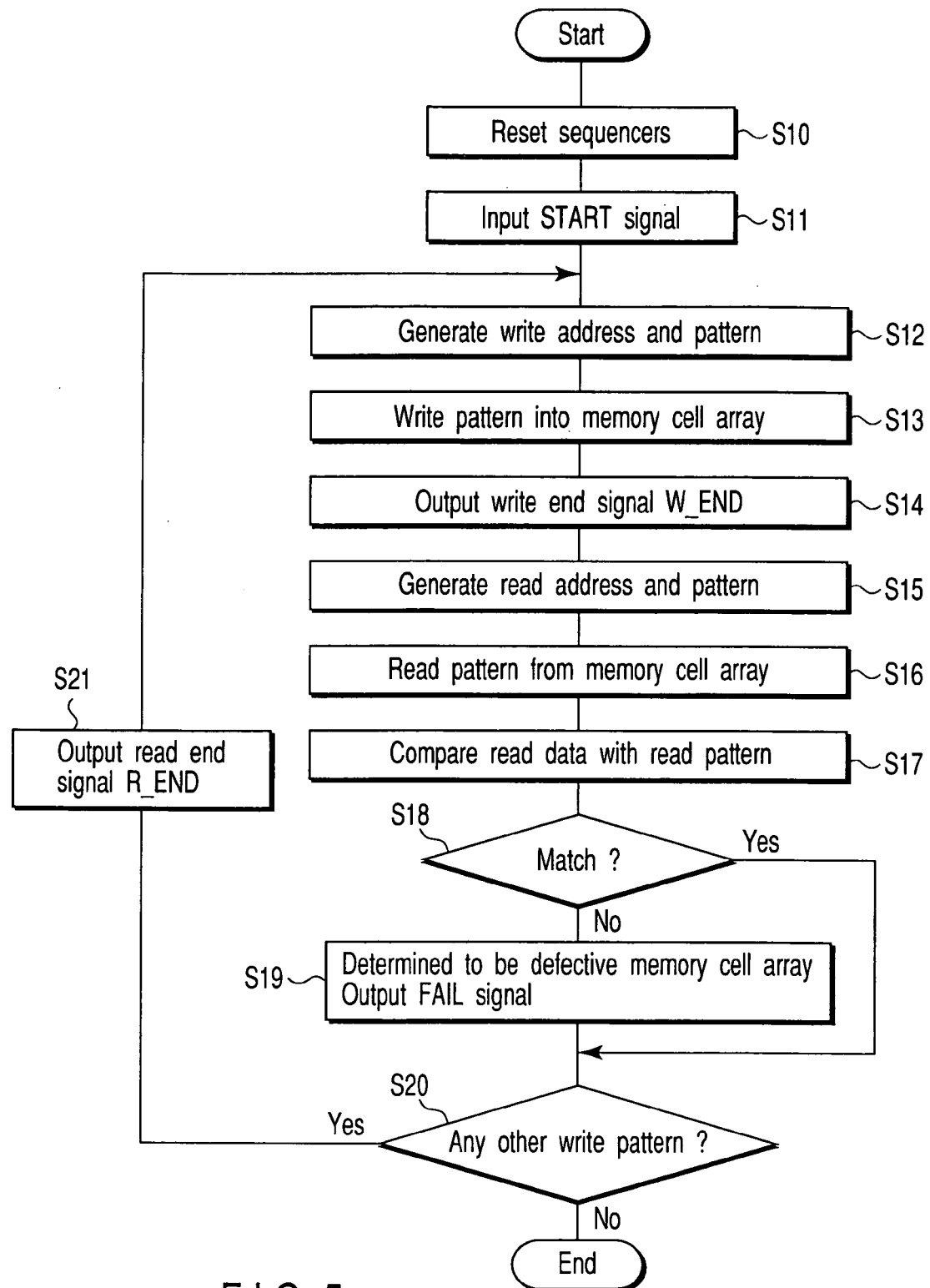
FIG. 5 is a flowchart illustrating the flow of a test method employed when the semiconductor integrated circuit device of the first embodiment is in an alternative mode.
Figure 6:
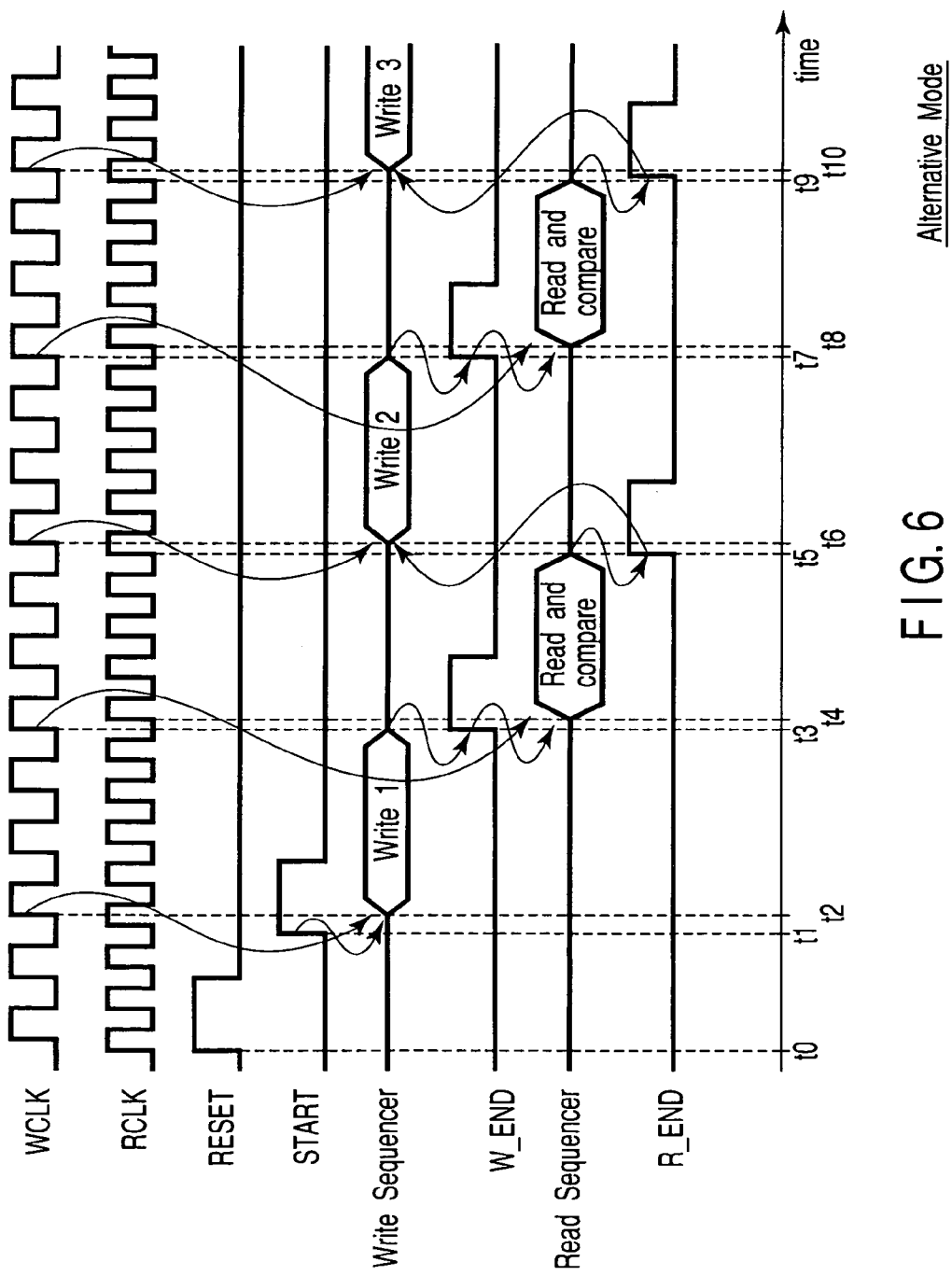
FIG. 6 is a timing chart of various signals output when the semiconductor integrated circuit device of the first embodiment is tested in the alternative mode.

FIG. 5 is a flowchart useful in explaining a test method performed in the alternative mode, and FIG. 6 is a timing chart of various signals output during a test in the alternative mode. FIG. 6 also illustrates the operation states of the write and read sequencers 51 and 52.

In the alternative mode, the clock generators 40 and 41 respectively generate write and read clock signals WCLK and RCLK that are not synchronized with each other. The clock signal WCLK is supplied to the semiconductor memory 20 and write sequencer 51, while the clock signal RCLK is supplied to the semiconductor memory 20 and read sequencer 52.

Before starting a test, the sequencer controller 55 supplies a reset signal RESET to the write and read sequencers 51 and 52 and fail signal output circuit 54 (time t0 in FIG. 6). Upon receiving the reset signal RESET, the write and read sequencers 51 and 52 and fail signal output circuit 54 are reset (step S10 in FIG. 5). More specifically, in the sequencers 51 and 52, the controller 60 initializes the pattern generator 61 and address generator 62. Further, the output of the fail signal output circuit 54 is initialized.

Subsequently, the sequencer controller 55 supplies the write and read sequencers 51 and 52 with a mode signal MODE indicating the alternative mode. This is the completion of the preparation for test operations in the sequencers 51 and 52.

In this states a test is started. Firstly, the sequencer controller 55 supplies a start signal START to the write sequencer 51 (step S11, time t1). Upon receiving the start signal START, the write sequencer 51 starts a write operation in synchrony with the clock signal WCLK (time t2). The write operation is performed in the following manner: Firstly, in response to an instruction from the controller 60 of the write sequencer 51, the pattern generator 61 generates write pattern data W_DATA, and the address generator 62 generates an address signal W_ADDR (step S12). The pattern data W_DATA indicates, for example, a data pattern for writing "1" into all memory cells, a data pattern for writing "0" into all memory cells, a checker board pattern or a random pattern. Thus, the pattern data W_DATA is not fixed. The controller 60 further generates a write enable signal WE.

In response to the write pattern data W_DATA, address signal W_ADDR and write enable signal WE, the pattern data W_DATA is written into the memory cells in the memory cell array of the semiconductor memory 20 that correspond to the address signal W_ADDR (step S13).

After the pattern data W_DATA has been written into the memory cells, the controller 60 of the write sequencer 51 outputs an end signal W_END to the read sequencer 52 (step S14, time t3).

Upon receiving the end signal W_END, the read sequencer 52 starts a read operation in synchrony with the clock signal RCLK (time t4). The read operation is performed in the following manner: Firstly, in response to an instruction from the controller 60 of the read sequencer 52, the pattern generator 61 generates pattern data R_DATA as expected data, and the address generator 62 generates an address signal R_ADDR (step S15). The pattern data R_DATA as expected data is identical to the write pattern data W_DATA generated by the write sequencer 51 at the time t2. The controller 60 further generates a read enable signal RE.

In response to the address signal R_ADDR and read enable signal RE, data is read from the memory cells in the memory cell array of the semiconductor memory 20 that correspond to the address signal R_ADDR (step S16).

The data read from the memory cells (i.e., read data) is supplied to the data compression/comparison circuit 53 via the data latch 30. The data compression/comparison circuit 53 compares the read data with the expected pattern data R_DATA generated by the read sequencer 52 (step S17), and compresses the comparison result. The comparison result is input to the fail signal output circuit 54. If the read data is not identical to the expected pattern data R_DATA, the fail signal output circuit 54 determines that the memory cell array of the semiconductor memory includes a defective cell, and outputs a fail signal FAIL (step S19). If, on the other hand, the read data is identical to the expected pattern data R_DATA (step S18), no fail signal FAIL is output.

If all data patterns have been written (step S20), the test is finished. If the test is continued using another data pattern (step S20), the controller 60 of the read sequencer 52 outputs an end signal R_END to the write sequencer 50 (step S21, time t5).

Upon receiving the end signal R_END, the write sequencer 51 starts a write operation in synchrony with the clock signal WCLK (time t6). After that, the same writing operation as that performed at the steps S12 and S13 is performed. The pattern data W_DATA generated at this time may be identical to or different from the previously written pattern data. After finishing the write operation, the controller 60 of the write sequencer 51 outputs an end signal W_END to the read sequencer 52 (step S14, time t7). Upon receiving the end signal W_END, the read sequencer 52 starts a read operation and data comparison in synchrony with the clock signal RCLK (time t8). The read operation is the same as that performed at the steps S15 to S19.

If there is a further data pattern to be written, the processing at the step S12 et seq. is repeated, whereas if there is no more data pattern, the test is finished.

<Successive Mode>

The successive mode is a test mode in which the clock signal WCLK for controlling writing is synchronized with the clock signal RCLK for controlling reading. In the successive mode, write and read operations are performed in a parallel manner such that the read operation is performed a little bit later than the write operation.

Figure 7:
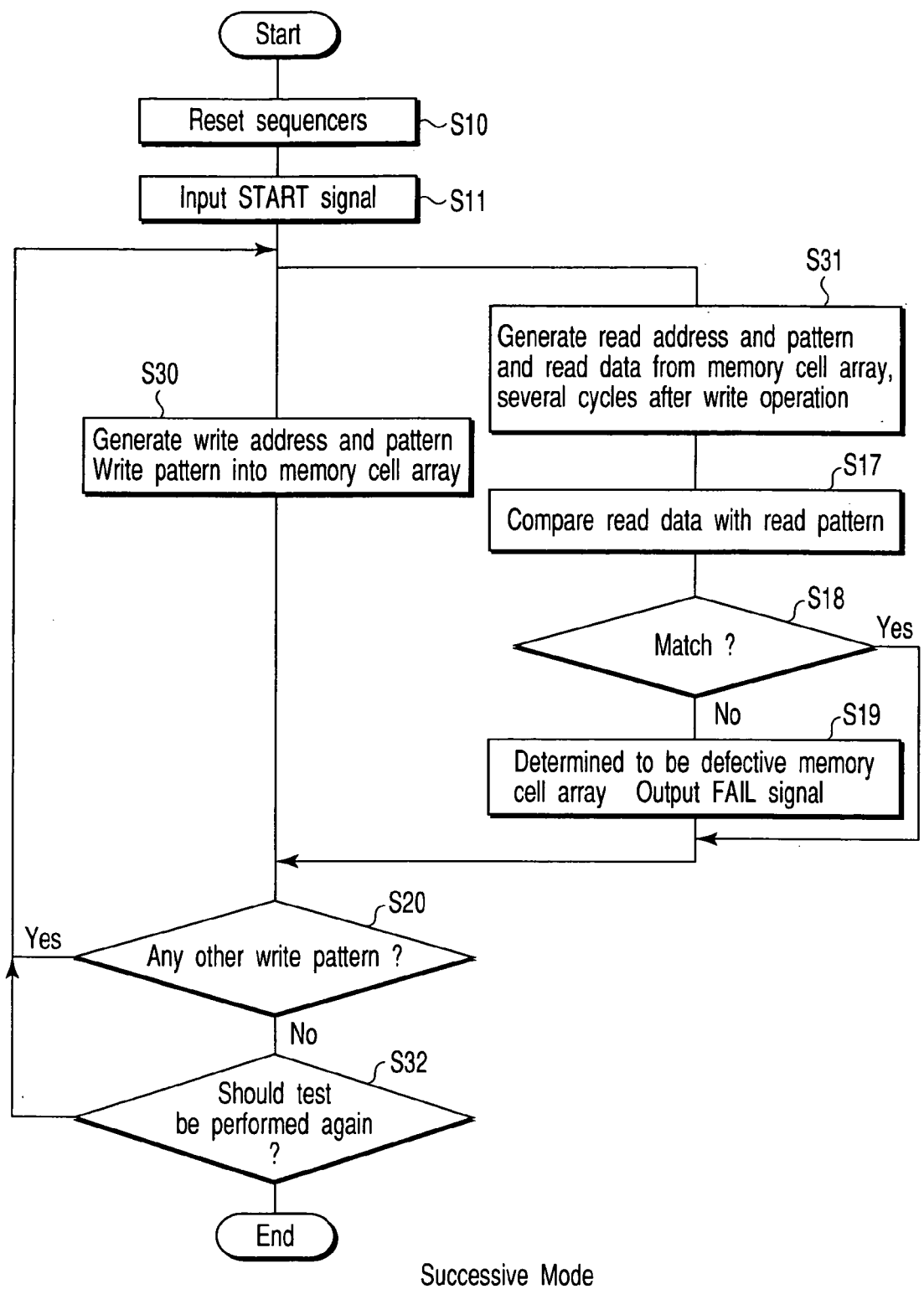
FIG. 7 is a flowchart illustrating the flow of a test method employed when the semiconductor integrated circuit device of the first embodiment is in a successive mode.
Figure 8:
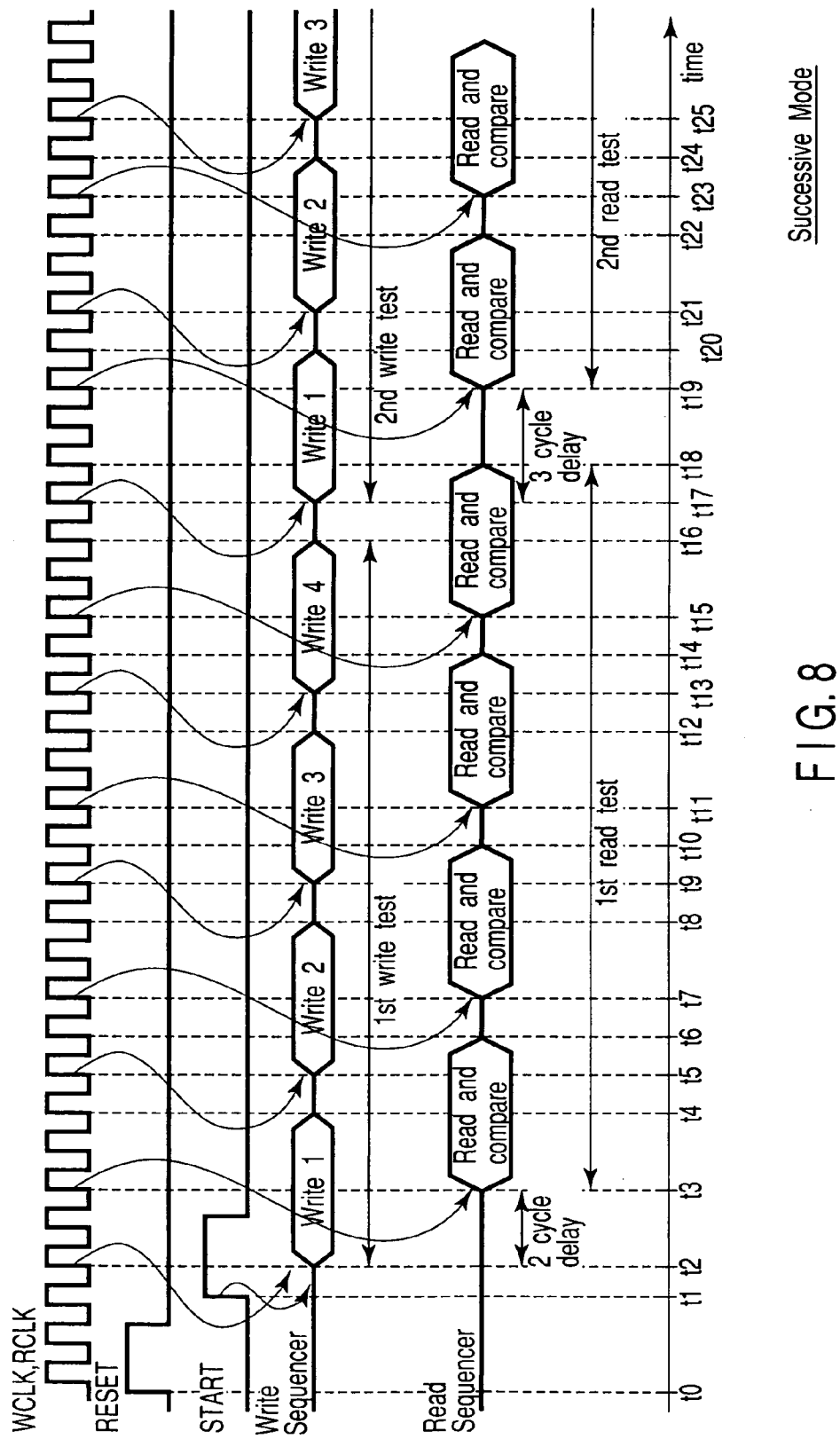
FIG. 8 is a timing chart of various signals output when the semiconductor integrated circuit device of the first embodiment is tested in the successive mode.

FIG. 7 is a flowchart useful in explaining a test method performed in the successive mode, and FIG. 8 is a timing chart of various signals output during a test in the successive mode. FIG. 8 also illustrates the operation states of the write and read sequencers 51 and 52.

In the successive mode, the clock generators 40 and 41 respectively generate write and read clock signals WCLK and RCLK that are synchronized with each other. The clock signal WCLK is supplied to the semiconductor memory 20 and write sequencer 51, while the clock signal RCLK is supplied to the semiconductor memory 20 and read sequencer 52. The clock generators 41 and 42 may be modified such that only one of them operates to supply one of the clock signals WCLK and RCLK to the semiconductor memory 20 and write and read sequencers 51 and 52.

Before starting a test, the sequencer controller 55 supplies a reset signal RESET to the write and read sequencers 51 and 52 and fail signal output circuit 54, thereby initializing them (step S10 in FIG. 7, time t0 in FIG. 8), as in the alternative mode.

Subsequently, the sequencer controller 55 supplies the write and read sequencers 51 and 52 with a mode signal MODE indicating the successive mode. This is the completion of the preparation for test operations in the sequencers 51 and 52.

In this state, a test is started. Firstly, the sequencer controller 55 supplies a start signal START to the write sequencer 51 (step S11, time t1). Upon receiving the start signal START, the write sequencer 51 starts a write operation in synchrony with the clock signal WCLK (step S30, time t2). The write operation is performed in the same manner as that performed at the steps S12 and S13 in the alternative mode. During the test, the start signal START is fixed at the high level "H", which differs from the alternative mode.

A predetermined number of clock cycles (two cycles in the case of FIG. 8) after the write sequencer 51 starts the write operation, the read sequencer 52 starts a read operation in synchrony with the clock signal RCLK (step S31, time t3). The time corresponding to the clock cycles will hereinafter be referred to as a "delay time". The read operation is performed in the same manner as that performed at the steps S15 and S16 in the alternative mode. Further, the start signal START is also input to the read sequencer 52 to make it to start the read operation, which is not shown, though.

Thus, the read operation is performed in substantially parallel with the write operation but several clocks later than the latter. In the example of FIG. 8, writing of a data pattern is started at the time t2 and finished at a time t4, and the reading of the data written during the period between the times t2 and t4 is started at the time t3 two clocks later than the time t2, and finished at a time t5. Accordingly, during the period between the times t3 and t4, the write and read operations are performed simultaneously but independently of each other.

After the read sequencer 52 reads data from memory cells, the data compression/comparison circuit 53 performs the same processing as that at the step S17 in the alternative mode, thereby comparing the read data with expected pattern data. In accordance with the comparison result, the fail signal output circuit 54 outputs a fail signal FAIL (step S19).

If all data patterns have been written (step S20), the test is finished. If the test is continued using another data pattern (step S20), the program returns to the step S30 several cycles later (one cycle later in the case of FIG. 8) than the end of the preceding write operation, thereby repeating the write operation. In this case, the read sequencer 52 also repeats the step S31 et seq. several cycles later (one cycle later in the case of FIG. 8) than the end of the preceding read operation. The idle period of several cycles provided before repeating the write or read operation may be omitted if it is not needed.

As described above, write and read operations are repeated for processing all write pattern data items W_DATA. In the example of FIG. 8, the write operation is repeated four times (using four data patterns).

After finishing the writing of all data patterns, the sequencer controller 55 determines whether the test should be performed again (step S32). If the test is resumed, the state signal START is kept at "H". As a result, the write sequencer 51 repeats the process at the step S30 et seq., while the read sequencer 52 repeats the process at the step S31 et seq. During the repetition, the read sequencer 52 can reset the delay time. For example, in FIG. 8, the delay time is set to two cycles in the first test, and changed to three cycles in the second test.

If all data patterns have been written and it is determined that no further test is necessary, the test is finished.

The semiconductor integrated circuit device of the first embodiment can simplify the test method for the semiconductor memory 20. This will now be described in detail.

In the configuration of the embodiment, the BIST circuit 50 is provided for testing the semiconductor memory 20 embedded in the LSI 10. The BIST circuit 50 has a BIST sequencer unit for controlling the write and read operations performed on the semiconductor memory 20.

The BIST sequencer unit includes the write sequencer 51 and read sequencer 52. Thus, the write and read operations are controlled by independent sequencers. Using the two sequencers 51 and 52, the BIST circuit 50 can create two operation states, i.e., the successive mode in which the write and read clock signals WCLK and RCLK are synchronized with each other, and the alternative mode in which the write and read clock signals WCLK and RCLK are not synchronized.

In the alternative mode, the write and read sequencers 51 and 52 perform write and read operations alternately. After finishing respective operations, the sequencers 51 and 52 access each other. That is, when one sequencer finishes its operation, it outputs an end signal to the other. The end signal serves as a start signal to make the other sequencer to start an operation.

On the other hand, in the successive mode, the write and read sequencers 51 and 52 perform write and read operations in a parallel manner independently.

As stated above, the two sequencers 51 and 52 enable the semiconductor memory 20 to be tested in two modes. The sequencers 51 and 52 control the test of the operations of the memory, and generate address signals and data patterns. Therefore, it is not necessary to input such signals from the outside, the test patterns can be made small, and the time required for the test can be shortened.

Furthermore, the write and read sequencers 51 and 52 can be made to have the same basic configuration. This enables the BIST circuit 50 to be designed very easily, thereby reducing the time and cost required for manufacturing LSIs.

Referring to FIG. 9, a semiconductor integrated circuit device according to a second embodiment of the invention will be described. FIG. 9 is a block diagram illustrating the internal configuration of a memory-embedded LSI. The second embodiment relates the configuration for better enhancing the reliability of the operation of the LSI of the first embodiment.

As shown in FIG. 9, the LSI 10 of the second embodiment further comprises a write address signal scramble circuit 70 and read address signal scramble circuit 71, in addition to the elements of the first embodiment shown in FIG. 1. Further, the BIST circuit 50 includes flip-flops 57-1 to 57-8.

The write address signal scramble circuit 70 and read address signal scramble circuit 71 are provided to cause the write address signal W_ADDR and read address signal R_ADDR to match the addresses assigned to the memory cells of the semiconductor memory 20. The write address signal W_ADDR and read address signal R_ADDR each contain a plurality of sequential addresses. On the other hand, in the memory cell array of the semiconductor memory 20, addresses are not always assigned to the memory cells in order. The scramble circuits 70 and 71 relate the addresses, contained in the address signals W_ADDR and R_ADDR, to the addresses of the memory cells.

The flip-flops 57-1 and 57-2 are provided in series across the signal line for transmitting an end signal W_END from the write sequencer 51 to the read sequencer 52. The flip-flops 57-3 and 57-4 are provided in series across the signal line for transmitting an end signal R_END from the read sequencer 52 to the write sequencer 51. The flip-flops 57-5 and 57-6 are provided in series across the signal line for transmitting a read enable signal RE from the read sequencer 52 to the fail signal output circuit 54. The flip-flops 57-7 and 57-8 are provided in series across the signal line for transmitting read pattern data R_DATA from the read sequencer 52 to the data compression/comparison circuit 53. Each of the flip-flops 57-1 to 57-8 is, for example, a D-F/F. It is sufficient if the flip-flops can delay a signal. Accordingly, other elements may be used instead of the flip-flops, if they can delay a signal in synchrony with a clock signal.

The semiconductor integrated circuit device of the second embodiment has the advantage that its operation is highly reliable during a test, as well as the advantages of the first embodiment. That is, the scramble circuits 70 and 71 enable data to be more accurately written to and read from memory cells of designated addresses.

Further, the flip-flops 57-1 to 57-8 enable writing, reading and comparison of data and fail-signal-output operations to be performed more accurately. For example, in the alternative mode, the write end signal W_END is supplied to the read sequencer 52 via the two flip-flops 57-1 and 57-2. This means that the write end signal W_END reaches the read sequencer 52 several clock cycles after the output of the signal by the write sequencer 51. In other words, the read sequencer 52 starts its operation after several clock cycles have surely elapsed from the end of a write operation. The same can be said of the read end signal R_END. That is, the write sequencer 51 starts its operation after several clock cycles have surely elapsed from the end of a read operation. By virtue of this control of operation timing, the sequencers 51 and 52 never perform write and read operations simultaneously in the alternative mode.

The same can be said of the data compression/comparison circuit 53. The expected pattern data R_DATA reaches the data compression/comparison circuit 53 several clock cycles after the start of the operation of the read sequencer 52. This is because the flip-flops 57-7 and 57-8 delay the expected pattern data R_DATA. Similarly, the read enable signal RE reaches the fail signal output circuit 54 several clock cycles after the start of the operation of the read sequencer 52, since the flip-flops 57-5 and 57-6 delay the read enable signal RE. Thus, after the read operation has surely started, data comparison and output of a fail signal are performed.

Figure 10:
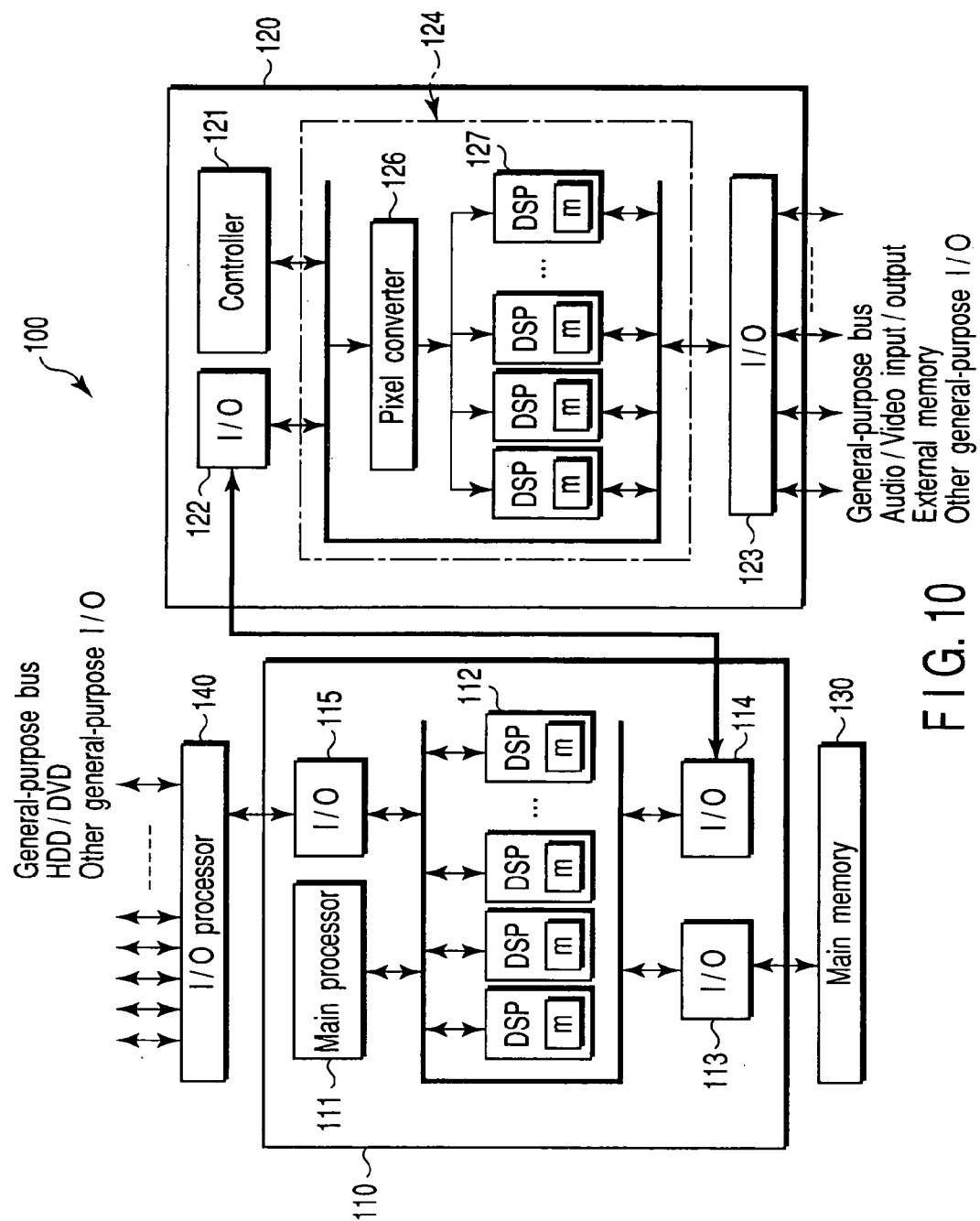
FIG. 10 is a block diagram illustrating a semiconductor integrated circuit device according to a third embodiment of the invention.

Referring then to FIG. 10, a semiconductor integrated circuit device according to a third embodiment of the invention will be described. In the third embodiment, the BIST circuit 50 described in the first and second embodiments is incorporated in a processor system. FIG. 10 is a block diagram illustrating a processor system that performs data transfer using direct memory access (DMA).

As shown, a processor system 100 comprises a host processor 110, image processor 120, main memory 130 and I/O processor 140.

The host processor 110 includes a main processor 111, digital signal processors (DSPs) 112, and I/O sections 113, 114 and 115 for receiving and outputting signals from and to the outside of the processor 110. The I/O section 113 receives and outputs signals from and to the main memory 130. The I/O section 114 receives and outputs signals from and to the image processor 120. The I/O section 115 receives and outputs signals from and to the I/O processor 140.

The image processor 120 has a controller 121, I/O sections 122 and 123 and computing section 124. The I/O section 122 receives and outputs signals from and to the host processor 110. The I/O section 123 receives and outputs signals from and to a general-purpose bus, such as a PCI, video player and/or audio player. The computing section 124 performs computation for image processing.

The computing section 124 has a pixel converter 126 and computation units (DSPs) 127. The pixel converter 126 converts the summit information of polygons into pixel data. The computing unit 127 processes pixel data.

The I/O processor 140 controls connection to the general-purpose bus, peripheral devices, such as an HDD or DVD (digital versatile disc) drive, and networks.

Figure 11:
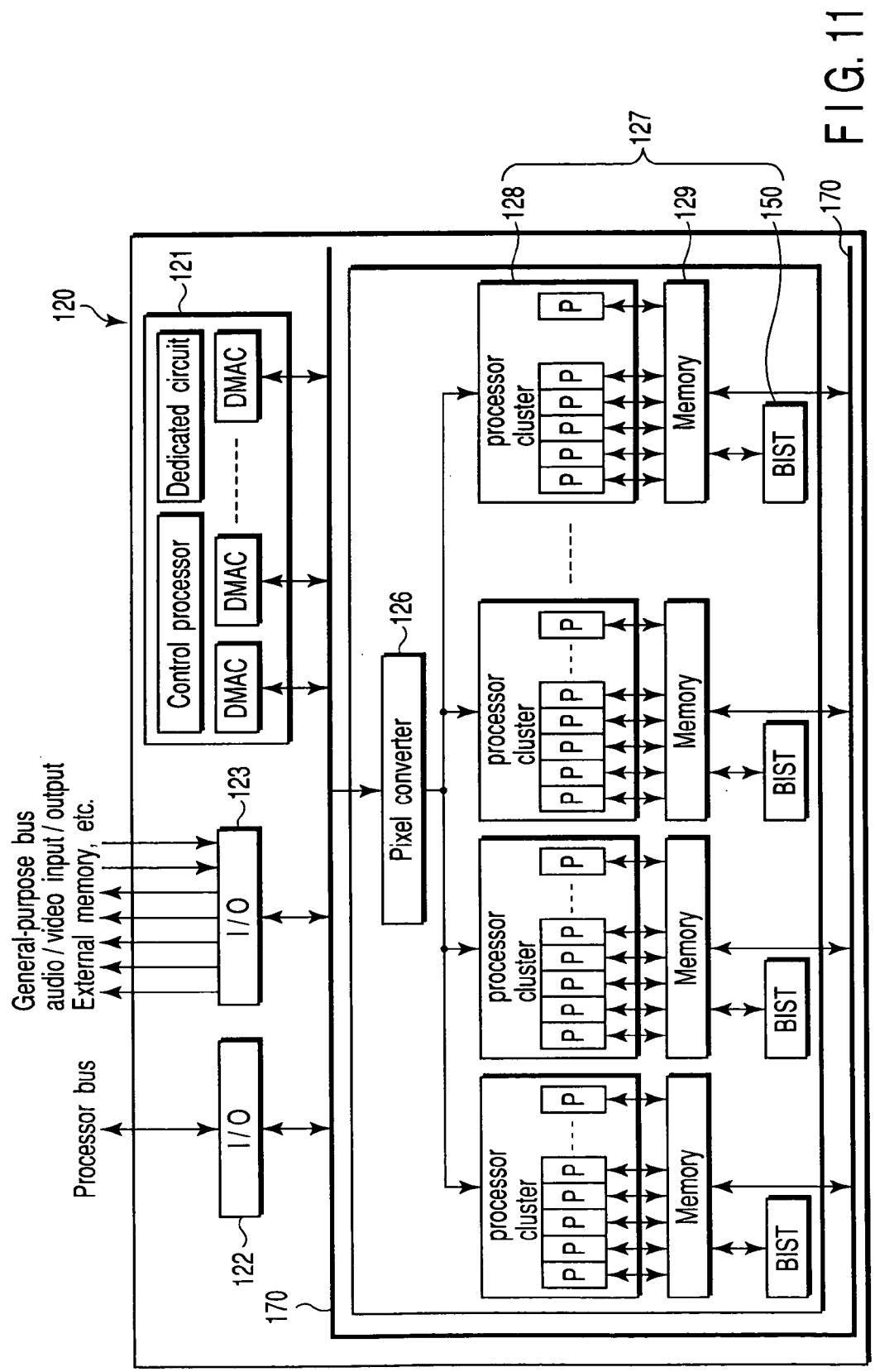
FIG. 11 is a block diagram illustrating in more detail the internal configuration of an image processor incorporated in the semiconductor integrated circuit device of the third embodiment.

FIG. 11 shows, in more detail, the internal configuration of the image processor 120. As shown, the computing units 127 each include a processor cluster 128, memory 129 and BIST circuit 150. The processor cluster 128 includes a plurality of processors P. The processors P can execute individual processes in a parallel manner, and cooperate to execute a single process. The memory 129 stores processing results obtained by the processor cluster 128. The BIST circuit 150 is identical to the BIST circuit 50 described in the first and second embodiments, and is used to test the memory 129. Specifically, the BIST circuit 150 comprises a data write sequencer 51 and read sequencer 52. During a test, the BIST circuit 150 is operable in the two modes as described in the first embodiment, i.e., the alternative and successive modes.

The controller 121, pixel converter 126, I/O sections 122 and 123 and memory 129 are connected to a common bus 170. Although not shown in FIG. 11, a write clock signal WCLK and read clock signal RCLK are supplied to the BIST circuit 150. These clock signals may be supplied from the outside of the image processor 120. Alternatively, the image processor 120 may have a clock generation circuit.

FIG. 12 is a block diagram illustrating an internal configuration example of the controller 121 included in the image processor 120. As shown, the controller 121 comprises DMA controllers (DMACS) 131, dedicated circuit 132, control processor 133, timer 134, interrupting section 135, memory 136 and BIST circuit 151.

Each DMAC 131 controls data transfer between the computing units 127 and between the computing units 127 and memory 136. The dedicated circuit 132 is provided just for this system for activating the DMACs 131 and computing units 127. The control processor 133 is, for example, a general-purpose processor. In response to a program code stored in the memory 136 or an instruction from the host processor 110, the control processor 133 controls the dedicated circuit 132. The timer 134 performs time management, and instructs, when necessary, the interrupting section 135 to perform an interruption. Upon receiving a signal from the timer 134 or receiving an end signal from the DMACs 131 or computing units 127, the interrupting section 135 interrupts the control processor 133. The BIST circuit 151 is identical to the BIST circuit 50 described in the first and second embodiments, and used to test the memory 136. Specifically, the BIST circuit 151 comprises a data write sequencer 51 and read sequencer 52. During a test, the BIST circuit 150 is operable in the two modes as described in the first embodiment, i.e., the alternative and successive modes.

The dedicated circuit 132, timer 134, interrupting section 135 and memory 136 are connected to a local network 137. The host processor 110 is also connected to the local network 137 via the I/O section 122. Although not shown in FIG. 12, a write clock signal WCLK and read clock signal RCLK are supplied to the BIST circuit 151. These clock signals may be supplied from the outside of the controller 121. Alternatively, the controller 121 may have a clock generation circuit.

Figure 13:
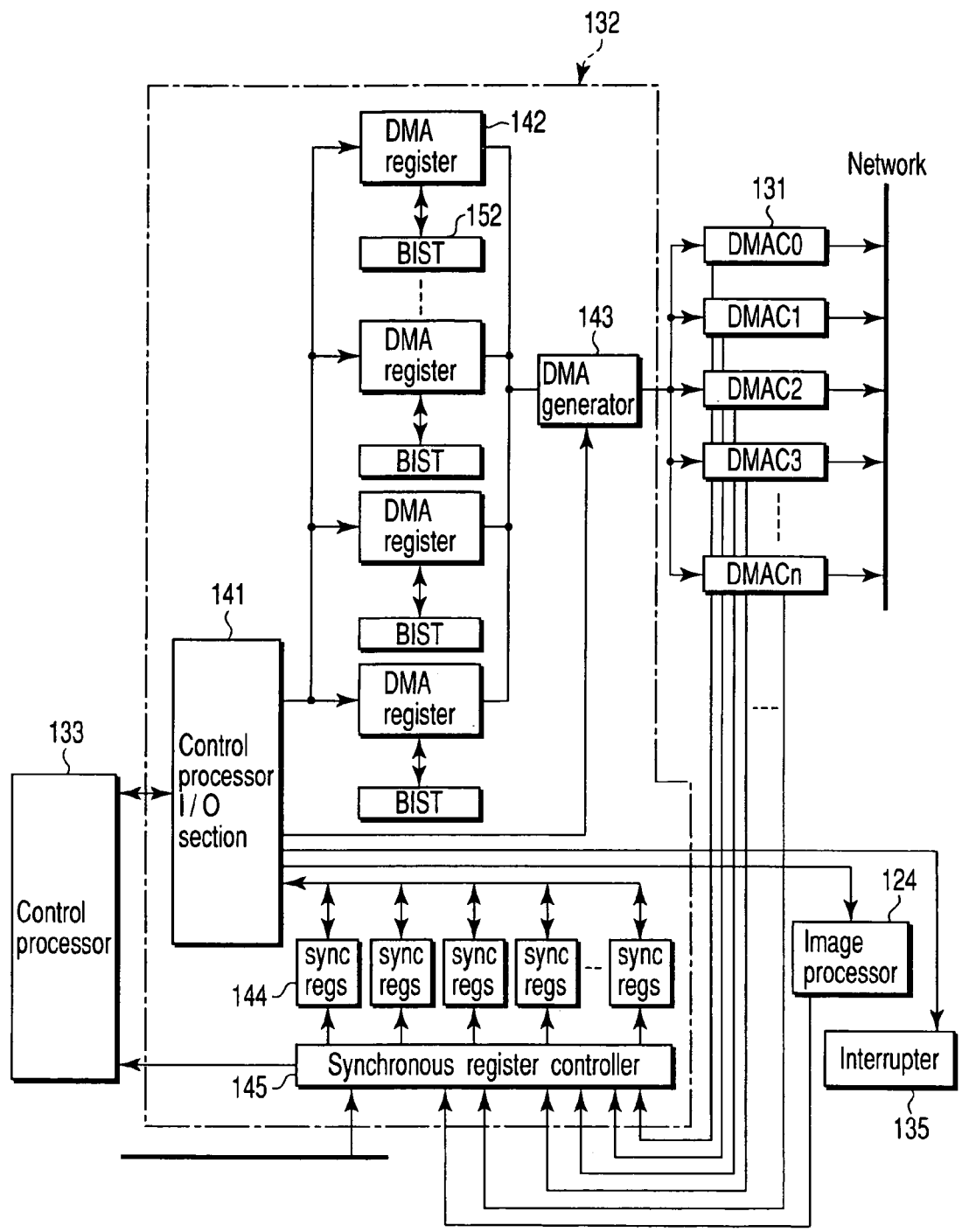
FIG. 13 is a block diagram illustrating a circuit dedicated to the controller shown in FIG. 12.

FIG. 13 is a block diagram illustrating an internal configuration example of the dedicated circuit 132 included in the controller 121. In the case of FIG. 13, the dedicated circuit 132 is used as a coprocessor for the control processor 133. As shown, the dedicated circuit 132 includes a control processor I/O section 141, DMA registers 142, DMA generator 143, sync registers 144, sync register controller 145 and BIST circuits 152 provided for the respective DMA registers 142.

The control processor I/O section 141 receives and outputs signals from and to the control processor 133. The DMA registers 142 store various types of data needed for operating the DMACs 131. The DMA generator 143 transfers data stored in the registers 142 to the DMACs 131. The control processor 133 determines from which one of the DMA registers 142 to which one of the DMACs 131 data should be transferred, and informs the DMA generator 143 of this via the control processor I/O section 141. The sync registers 144 store the operation states of the DMACs 131 and computing units 127. The sync register controller 145 controls updating of the sync registers 144. The BIST circuits 152 are identical to the BIST circuit 50 described in the first and second embodiments, and used to test the DMA registers 142. Specifically, the BIST circuit 152 comprises a data write sequencer 51 and read sequencer 52. During a test, the BIST circuit 152 is operable in the two modes as described in the first embodiment, i.e., the alternative and successive modes.

As is understood from the third embodiment, the BIST circuit 50 employed in the first and second embodiments can be used in an LSI that is provided with a plurality of semiconductor memories.

As described above, the semiconductor integrated circuit devices of the first to third embodiments incorporate a write BIST sequencer and read BIST sequencer. During a test, the BIST sequencers generate pattern data and address signals. Accordingly, writing and reading of data into and from the semiconductor memory can be virtually realized, using both the test mode (successive mode) in which the write clock WCLK and read clock RCLK are synchronized, and the test mode (alternative mode) in which these clocks are not synchronized. Accordingly, the scale of test patterns can be reduced, and the time required for a test can be shortened. Furthermore, the write and read BIST sequencers can have the same structure, which makes it very easy to design the BIST circuit, resulting in reduction of the time and cost required for manufacturing LSIs. In addition, since a BIST sequencer is provided for each semiconductor memory, a CPU or DSP that operates at a high frequency of, for example, several GHz can be tested under actual operation conditions.

The first and second embodiments employ a 2-port semiconductor memory, in particular, a 1R/1W (1-read/1-write), 2-port semiconductor memory that has a set of terminals for write data and a set of terminals for read data. However, the embodiment is also applicable to a 2R/2W, 4-port semiconductor memory that has two sets of terminals for write data and two sets of terminals for read data. It is sufficient if the semiconductor memory has a write terminal and read terminal independent of each other.

In the successive mode, a read operation is started several clocks later than the start of a write operation. In this case, it is desirable to set the delay time to a value not more than the time needed for the write sequencer 51 to write one data pattern. In the case of FIG. 9, for example, the time required for writing one data pattern is four cycles. Accordingly, the delay time must be four cycles at maximum. On the other hand, since simultaneous occurrence of write and read operations must be avoided, it is desirable to set the delay time to two cycles or more so as to avoid problems in the operation timing of the two sequencers 51 and 52.

In the first and second embodiments, the data latched by the data latch 30 can be output to the outside (Scan-out). This can be realized if, for example, the sequencer controller 55 instructs the read sequencer 52 to do so, using a mode signal MODE.

Figure 14:
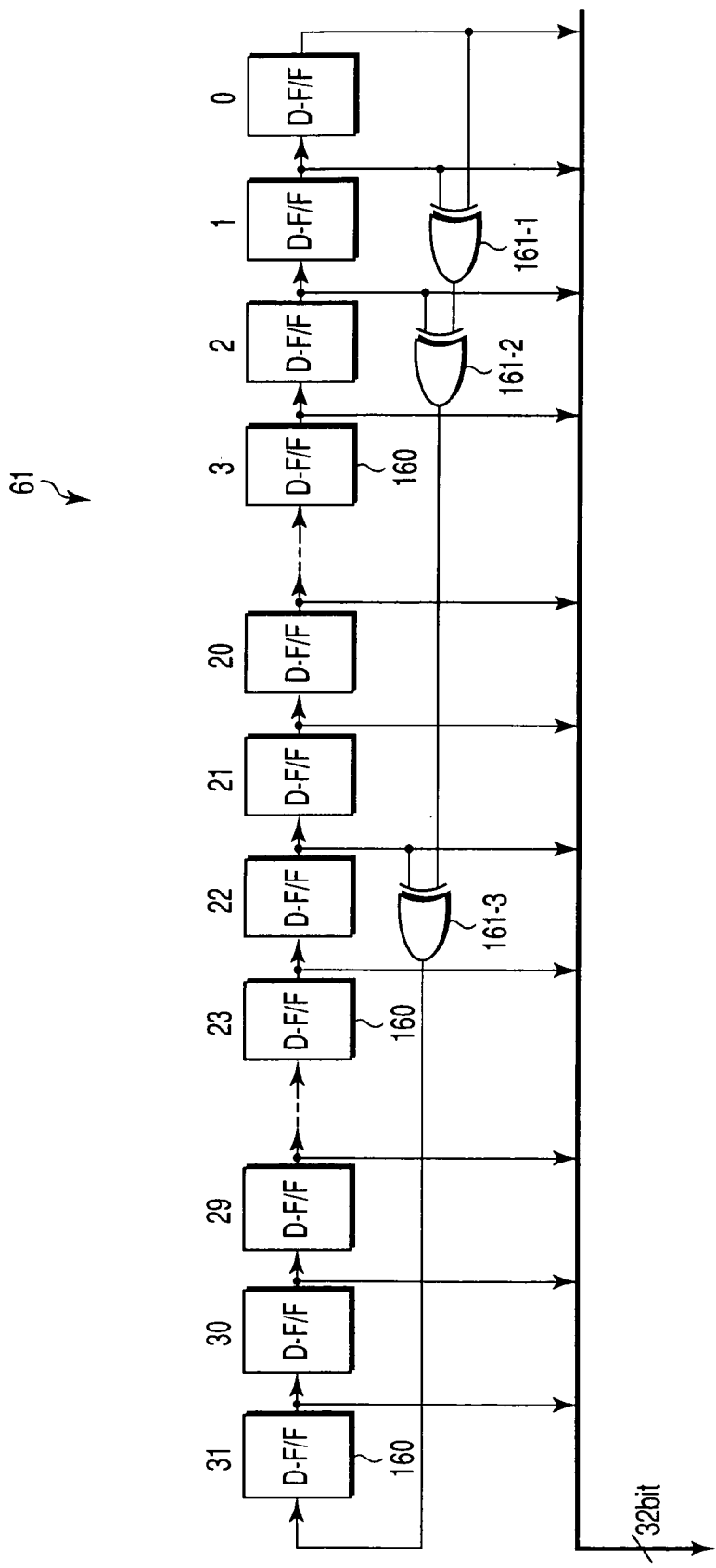
FIG. 14 is a circuit diagram illustrating a pattern generator example employed in each of write and read sequences incorporated in the semiconductor integrated circuit devices of the first to third embodiments.

FIG. 14 is a circuit diagram illustrating an example of the pattern generator 61 incorporated in the sequencer 51 or 52. As shown, the pattern generator 61 has thirty-two D-F/Fs 160 and three OR circuits 161-1 to 161-3. The OR circuit 161-1 executes an OR operation of the outputs of the first- and second-stage flip-flops 160. The OR circuit 161-2 executes an OR operation of the outputs of the second-stage flip-flop 160 and OR circuit 161-1. The OR circuit 161-3 executes an OR operation of the output of the 23rd-stage flip-flop 160 and OR circuit 161-2. The output of the OR circuit 161-3 is input to the last-stage (32nd-stage) flip-flop 160. The output of each flip-flop 160 is supplied to a 32-bit bus. The pattern generator 61 constructed as above is a linear feedback shift register for outputting a pattern expressed by $(x^{32}+x^{22}+x^2+x+1)$.

FIGS. 15 and 16 are flowcharts illustrating the flows of a test method employed in a semiconductor integrated circuit device according to a modification of the first to third embodiments. FIG. 15 shows the alternative mode of the method, while FIG. 16 shows the successive mode of the method. In the above-described embodiments, after write and read operations are performed for a write data pattern, a fail signal is output in accordance with the comparison result. However, as shown in FIGS. 15 and 16, a fail signal may be output if it is detected that writing of any one of write patterns has failed, after writing, reading and comparison have been performed for all write data patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor memory device which stores data;
   a first sequencer which controls writing of data into the semiconductor memory device; and
   a second sequencer which controls reading of data from the semiconductor memory device, wherein
   the first and second sequencers are each operable in a first mode and a second mode,
   the first and second sequencers operating in response to a first clock signal and a second clock signal, respectively,
   the first and second clock signals being not synchronized with each other in the first mode and synchronized with each other in the second mode.

2. The semiconductor integrated circuit device according to claim 1, wherein in the first mode,
   the first sequencer outputs a first end signal to the second sequencer after data has been written into the semiconductor memory device;
   the second sequencer starts reading of data from the semiconductor memory device in response to the first end signal, and outputs a second end signal to the first sequencer after finishing the data reading; and
   the first sequencer starts writing of data into the semiconductor memory device in response to the second end signal.

3. The semiconductor integrated circuit device according to claim 2, wherein:

the first and the second sequencer respectively include: an address signal generator which generates address signals; a data pattern generator which generates data patterns; and a controller which generates the first end signal indicating end of data writing and the second end signal indicating end of data reading;

the first sequencer writes the data pattern, generated by the data pattern generator of the first sequencer, into memory cells of the semiconductor memory device corresponding to the address signal generated by the address signal generator of the first sequencer; and the second sequencer reads data from memory cells of the semiconductor memory device corresponding to the address signal generated by the address signal generator of the second sequencer.

4. The semiconductor integrated circuit device according to claim 3, further comprising a comparator which compares the data read from the semiconductor memory device by the second sequencer, with the data pattern generated by the data pattern generator of the second sequencer.

5. The semiconductor integrated circuit device according to claim 3, wherein:

the address signal generated by the address signal generator of the second sequencer is identical to the address signal generated by the address generator of the first sequencer; and the data pattern generated by the data pattern generator of the second sequencer is identical to the data pattern generated by the data pattern generator of the first sequencer.

6. The semiconductor integrated circuit device according to claim 3, wherein the data pattern generator is a linear feedback shift register.

7. The semiconductor integrated circuit device according to claim 1, wherein in the second mode, the second sequencer starts a read operation a predetermined period after start of a write operation by the first sequencer.

8. The semiconductor integrated circuit device according to claim 1, wherein in the second mode, the second sequencer starts a read operation while the first sequencer is writing the data pattern.

9. The semiconductor integrated circuit device according to claim 1, wherein the semiconductor memory device includes at least a pair of clock signal input terminals which receives the first and second clock signals, a pair of data signal terminals which receives and outputs data, and a pair of address signal input terminals which receives address signals.

10. The semiconductor integrated circuit device according to claim 1, further comprising a sequencer controller which controls the first and second sequencers.

11. The semiconductor integrated circuit device according to claim 1, wherein the semiconductor memory device is embedded in a system LSI which performs an image processing.

* * * * *